(12) United States Patent
Van Der Wiel et al.

(10) Patent No.: US 12,046,685 B2
(45) Date of Patent: Jul. 23, 2024

(54) SEMICONDUCTOR DEVICE WITH PASSIVE MAGNETO-ELECTRIC TRANSDUCER

(71) Applicant: Melexis Bulgaria Ltd, Sofia (BG)

(72) Inventors: Appo Van Der Wiel, Tessenderlo (BE); Jeroen Didden, Tessenderlo (BE)

(73) Assignee: MELEXIS BULGARIA LTD, Sofia (BG)

( * ) Notice: Subject to any disclaimer, the term of this patent is extended or adjusted under 35 U.S.C. 154(b) by 62 days.

(21) Appl. No.: 17/331,437

(22) Filed: May 26, 2021

(65) Prior Publication Data

US 2021/0376166 A1    Dec. 2, 2021

(30) Foreign Application Priority Data

May 29, 2020 (EP) .................................... 20472006

(51) Int. Cl.
 *H01L 29/84* (2006.01)
(52) U.S. Cl.
 CPC .................................... *H01L 29/84* (2013.01)
(58) Field of Classification Search
 CPC ........ H01L 41/06; H01L 41/125; H01L 41/12
 See application file for complete search history.

(56) References Cited

U.S. PATENT DOCUMENTS

| | | | | |
|---|---|---|---|---|
| 4,520,413 A * | 5/1985 | Piotrowski | ............... | G11B 5/58 257/225 |
| 6,437,558 B2 | 8/2002 | Li et al. | | |
| 2013/0177781 A1 * | 7/2013 | Chepulskyy | ........ | H01F 10/3259 428/812 |
| 2014/0048896 A1 * | 2/2014 | Huang | ................. | G01R 33/098 257/421 |
| 2014/0084913 A1 * | 3/2014 | Kosel | ................. | G01R 33/0052 324/252 |
| 2016/0380029 A1 * | 12/2016 | Hase | ..................... | H01L 27/105 257/4 |
| 2018/0108834 A1 * | 4/2018 | Sasaki | ................. | H01F 10/3286 |
| 2018/0182951 A1 * | 6/2018 | Burssens | ............... | H10N 35/85 |
| 2019/0189172 A1 * | 6/2019 | Higo | ...................... | H10B 61/22 |

FOREIGN PATENT DOCUMENTS

| EP | 0091739 A1 | 10/1983 |
|---|---|---|
| EP | 3340323 B1 | 11/2019 |

OTHER PUBLICATIONS

Search Report and Written Opinion from corresponding European Application No. 20472006.4, Nov. 9, 2020.

* cited by examiner

*Primary Examiner* — Raj R Gupta
(74) *Attorney, Agent, or Firm* — Workman Nydegger (57) ABSTRACT

A semiconductor device includes a first diffusion region of a first type with embedded therein, a second and a third diffusion region of a second type different from the first type. The second and third diffusion regions are more doped than the first region. The second and third diffusion regions are each connected to a respective contact. A dielectric layer covers at least an edge of the second and third diffusion regions, and the region in between the second and third diffusion regions. A piezoelectric layer is disposed on, over, adjacent to or in contact with the dielectric layer. A first structure is in a first soft ferromagnetic material and is arranged to perform mechanical stress on the piezoelectric layer in response to a magnetic field.

18 Claims, 4 Drawing Sheets

SEMICONDUCTOR DEVICE WITH PASSIVE MAGNETO-ELECTRIC TRANSDUCER

FIELD OF THE INVENTION

The present invention is generally related to the field of semiconductor devices comprising a passive magneto-electric transducer structure and of passive magnetic switches.

BACKGROUND OF THE INVENTION

A reed switch is a well-known discrete electromechanical switch component that is operated by an applied magnetic field. It consists of a pair of contacts of ferrous metal reeds in a hermetically sealed glass envelope. The contacts may be normally open but closing when a magnetic field is present, or normally closed and opening when a magnetic field is applied. The switch may be actuated by a coil, making a reed relay, or by bringing a magnet near to the switch. Once the magnet is pulled away from the switch, the reed switch will go back to its original position. Reed switches are used for example as a proximity switch for a burglar alarm. The technology for making reed switches is very mature, but as such they cannot be integrated in semiconductor devices. A major advantage of reed switches is that they are passive devices, meaning that they do not require electrical energy for sensing the presence of a magnetic field.

There is a large push from the industry to replace reed switches with zero power solid state switches. This push is not only cost driven, but also driven to improve parameters such as size, speed and programmable switch conditions.

State of the art solutions make use of expensive materials such as GaAs in order to achieve this goal. Also piezoelectric materials such as PZT (lead zirconate titanate) and AlN need enhancement by modifying and doping with Scandium in order to reach sufficient sensitivity. As a result the production process cannot be executed in a low-cost standard CMOS fabrication process.

U.S. Pat. No. 6,437,558 is related to a system for detecting rotational speed of a rotor. The system comprises a passive magnetic field sensor with at least one multilayer material located adjacent to, but separate from, a rotatable rotor. The multilayer material contains a layer of a first thickness of a magnetostrictive material, connected across an interface to a layer of a second thickness of a piezoelectric material and configured so that, when the magnetostrictive material is subjected to a change in magnetic field from rotation of the rotor, a change in at least one dimension of the magnetostrictive material induces a strain in the piezoelectric material and produces a non-zero voltage signal in.

EP3340323 B1 presents a semiconductor device comprising a passive magneto-electric transducer structure, a semiconductor switch connected thereto and a substrate. This substrate comprises an elastomer layer wherein the transducer structure is mounted. The transducer structure has a terminal electrically connected to the gate terminal of the switch.

However, there is a need for further improvements to semiconductor devices containing a magneto-electric transducer.

SUMMARY OF THE INVENTION

It is an object of embodiments of the present invention to provide for a semiconductor device comprising a magneto-electric transducer. It is also an object to provide a passive magnetic semiconductor switch.

The above objective is accomplished by the solution according to the present invention.

In a first aspect the invention relates to a semiconductor device comprising :
  a first diffusion region of a first type with embedded therein a second and a third diffusion region of a second type different from the first type, said second and said third diffusion region more heavily doped than the first region, said second and third diffusion region each connected to a respective contact,
  a dielectric layer covering at least an edge of the second and third diffusion region and the region in between the second and third diffusion region,
  a piezoelectric layer disposed on, over, adjacent to or in contact with the dielectric layer,
  a first structure in a first soft ferromagnetic material and arranged to perform mechanical stress on the piezoelectric layer in response to a magnetic field.

The proposed solution indeed allows for obtaining a cost-efficient passive semiconductor device that can operate as a switch. When the device is approached with a magnet, said first structure in a first soft ferromagnetic material is attracted towards the magnet, which, depending on the position of the magnet with respect to the semiconductor device, causes a tensile stress or a compression stress on the piezoelectric layer, which in turn leads to the formation of a charge above the dielectric layer, which in turn leads to the creation of a channel between the second and third diffusion region, thereby opening the switch.

In an advantageous embodiment the first structure has a surface with a larger area than the surface of the piezoelectric layer facing said first structure. In embodiments the first structure has a surface is in area at least twice said surface of the piezoelectric layer.

In a preferred embodiment the semiconductor device further comprises a second structure in a second soft ferromagnetic material arranged to perform mechanical stress on the piezoelectric layer in response to the magnetic field. Due to this second structure a pulling force is created between the two structures which affects the piezoelectric layer to create a shear force. The second soft ferromagnetic material is in preferred embodiments the same as the first soft ferromagnetic material.

Preferably the second structure is disposed on a support layer.

In preferred embodiments that support layer is a further piezoelectric layer. Advantageously the semiconductor device further comprises a fourth diffusion region of the second type with embedded therein a fifth and a sixth diffusion region of the first type, said fifth and said sixth diffusion region more heavily doped than the fourth region, said fifth and sixth diffusion region each connected to a respective contact.

In some embodiment the semiconductor device comprises a flexible layer whereon at least said first structure is extended, said flexible layer having an opening to allow contact between said first structure and the piezoelectric layer. In one embodiment the flexible layer also extends on the second structure.

In a preferred embodiment the first structure has a larger edge at an outside of the semiconductor device than at a side facing said second structure.

Advantageously, the semiconductor device comprises in a gap between the first structure and the second structure a further structure in a ferromagnetic material. In one embodiment the further structure is thinner than said first structure and said second structure.

In preferred embodiments the gap between the first and second structures is comprised between 0.05 and 50 micron, most preferably between 0.05 and 5 micron.

In advantageous embodiments the semiconductor device is implemented as a field effect transistor.

In preferred embodiments the first structure and/or the second structure is a magnetic concentrator.

In some embodiments the piezoelectric layer is a polymer layer.

In another embodiment the ratio of the thickness of the piezoelectric layer to the thickness of the first structure is inversely proportional to the ratio of the stiffness of the piezoelectric layer to the stiffness of the first structure.

In embodiments of the invention the piezoelectric layer has a surface of substantially the same area as the area of a channel created, when in use, between the second and third diffusion region by charge displacement in the piezoelectric layer.

For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

The above and other aspects of the invention will be apparent from and elucidated with reference to the embodiment(s) described hereinafter.

BRIEF DESCRIPTION OF THE DRAWINGS

The invention will now be described further, by way of example, with reference to the accompanying drawings, wherein like reference numerals refer to like elements in the various figures.

DETAILED DESCRIPTION OF ILLUSTRATION EMBODIMENTS

The present invention will be described with respect to particular embodiments and with reference to certain drawings but the invention is not limited thereto but only by the claims.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

It should be noted that the use of particular terminology when describing certain features or aspects of the invention should not be taken to imply that the terminology is being re-defined herein to be restricted to include any specific characteristics of the features or aspects of the invention with which that terminology is associated.

In the description provided herein, numerous specific details are set forth. However, it is understood that embodiments of the invention may be practiced without these specific details. In other instances, well-known methods, structures and techniques have not been shown in detail in order not to obscure an understanding of this description.

Various embodiments of a semiconductor device with magneto-electric transducer comprising certain improvements are now described in detail.

Figure 1:
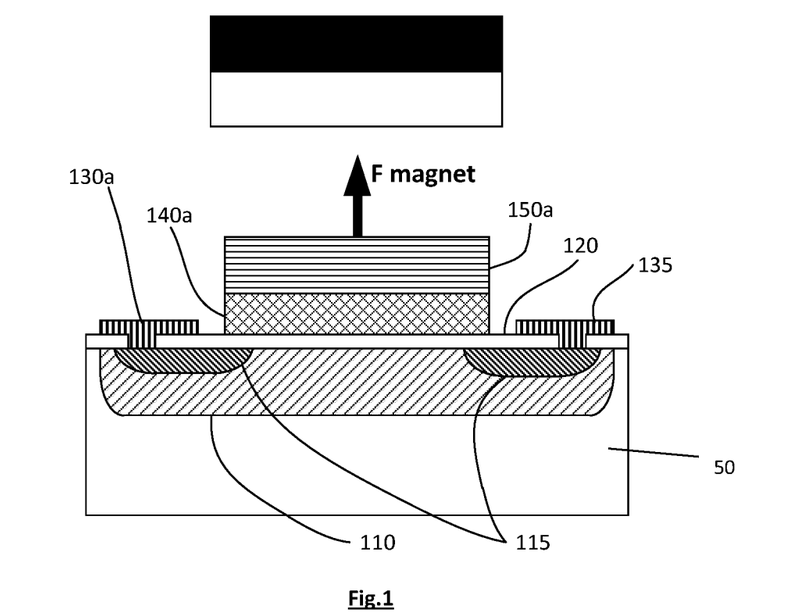
FIG. 1 illustrates an embodiment of the semiconductor device according to the invention.

The present invention discloses in one aspect a semiconductor device comprising a passive magneto-electric transducer, meaning that the transducer does not require electrical energy for sensing the presence of a magnetic field. FIG. 1 illustrates an embodiment wherein the semiconductor device comprises a semiconductor substrate (50). The substrate may for example be a CMOS substrate. In the substrate is embedded a diffusion region (110) lightly doped with a dopant of a first type, i.e. with either a p-type or n-type dopant. In the lightly doped diffusion region (110) are provided the second and third regions (115) which are doped with the opposite type of dopant with a higher doping concentration than the lightly doped diffusion regions, i.e. if the first region (110) is p-type doped, then the regions (115) are n-type dopant and vice versa. The semiconductor device comprises two terminals that each form a contact with one of the regions (115). These contacts are made in an opening in a dielectric layer (120) provided on the substrate. The dielectric layer at least covers the surface of the substrate between the two regions (115), thereby including at least an edge of each of the two regions. The dielectric layer fulfils two functions. It serves as a gate and it provides insulation for the interconnect (contacts through this layer). Practically the dielectric layer between the source and drain may in some embodiments be as thin as a gate oxide (e.g. <0.1 μm) and keep the thickness of the oxide above the source and drain as thick as standard passivation (e.g. >0.5 μm). These dielectric layers are made at different stages of the CMOS fabrication (the gate oxide before polysilicon deposition and the thick oxide thereafter). The semiconductor device further comprises a third terminal that acts as a control terminal, as will be detailed later in this description.

In another embodiment the second and third diffusion region (115) are embedded in the first diffusion region (110), which itself forms the substrate.

The semiconductor device is arranged to operate as a switch, so it switches between an open state and a closed state between terminal 130a and terminal 135. The magneto-electric transducer allows steering (controlling) the switch. Hence, the electrical resistive path between the two terminals changes, depending on the voltage applied to the control terminal. When the switch is in a closed state the electrical resistance is relatively low (ideally zero) and when the switch is in open state, the electrical resistance is relatively high (ideally infinitely high).

In preferred embodiments the semiconductor device is a field effect transistor (FET). The two heavily doped regions (115), i.e. the second and the third region, then correspond to a source and a drain (or a drain and a source), respectively, and the contacts are a source contact and a drain contact. The second region may be the source and the third region the drain or vice versa. Any type of FET can be used in embodiments of the invention, for example any FET selected from the group consisting of JFET, MOSFET, MNOS, DGMOSFET, DEPFET, FREDFET, HIGFET, MODFET, TFET, IGBT, HEMT, MESFET, VeSFET, CNTFET, OFET, QFET.

In FIG. 1 a magneto-electric transducer comprising a piezoelectric layer (140a) is placed on top of the dielectric layer (120). In alternative embodiments the piezoelectric layer is disposed over, adjacent to or in contact with the dielectric layer. In embodiments of the present invention the semiconductor device has an electrode of the piezoelectric layer integrated with the control terminal of the semiconductor device (i.e. with the gate in case of an implementation as FET). On top of the piezoelectric layer is provided a structure in a "soft" ferromagnetic material (i.e. one that can be magnetized easily and substantially loses magnetization after the external magnetic field has been removed). In some embodiments this structure (150a) in ferromagnetic material is an integrated magnetic concentrator (IMC). In a preferred embodiment the soft magnetic material is FeNi, i.e. a Nickel-Iron alloy. In other embodiments the structure may be a layer comprising material in for example FeGa, FeCo, FeTb, FeCoSiB or FeCoB.

When a magnet is approached to the soft-magnetic structure as illustrated in FIG. 1, i.e. from above the structure, the IMC structure 150a is attracted towards the magnet (a ferromagnetic structure is always attracted by a magnet regardless of whether it concerns a N or S pole) and generates a tensile stress (i.e. a stress tending to elongate the structure), in turn generating charges and opening the transistor. Similarly, if the magnet is approached from below the structure, a compression stress (i.e. a stress tending to shorten the structure) is generated.

Taking the example of a magnet approaching the structure from above as in FIG. 1, what happens can be described as follows. Due to the tensile force experienced by the soft-magnetic structure, the piezoelectric layer undergoes mechanical stress which causes a mechanical deformation of the layer 140a whereby a charge displacement occurs on the outer surfaces of the piezoelectric layer. A voltage difference ΔV is so created between the top of the piezoelectric layer and the control terminal (gate) with a charge at the top of the piezoelectric layer and a counter charge at the control terminal (gate). If the piezoelectric material is of high quality and behaves in a virtually ideal way, the voltage difference disappears when the tensile force disappears as well. However, in practice it may often occur that the behaviour is less than ideal and in such cases the voltage difference may appear like a spike, i.e. it can be a transient signal. In case the channel is only conducting during a spike, the transient switch signal can be used to latch another signal.

This forms the basis of the operation of the switch. The charge displacement in the piezoelectric layer also has effect in the substrate : the conductivity under the dielectric layer (the gate oxide) changes and an inversion layer is created. One so obtains a channel between the second and third region (115) (i.e. between source and drain). The switch 'closes' so to say, in other words the FET is 'on'. When the magnetic force disappears, the voltage ΔV disappears together with the charge at the bottom of the piezoelectric layer and the switch 'opens' (the FET is 'off'). Hence, the switch provides an electrical path with variable resistance, depending on the signal it receives from the magneto-electric transducer, more in particular from the piezoelectric layer. When the resistance value is lower than a predefined resistance value, e.g. lower than 1000 Ohm, the switch is considered to be "closed". When the resistance value is higher than said predefined number, the switch is considered to be "open". The area of the piezoelectric layer may be substantially equal to the area of the channel between the second and third region.

Hence, generally stated, the charge created by the piezoelectric layer directly modulates or inverts the conductivity under the dielectric layer without requiring an electrical connector or conductive plate between the piezoelectric layer and the gate. This also implies there is no need for an electrode at the top of the piezoelectric layer.

In the embodiment illustrated in FIG. 1 the piezoelectric layer (140a) and the IMC structure 150a have the same area. However, in other embodiments the IMC structure 150a may be bigger in area than the piezoelectric layer. This may be beneficial to increase the amount of stress created. The ratio of IMC structure area to piezoelectric layer area may be in certain embodiments 2, 10 or even 100. In embodiments with a bigger IMC structure area it may be beneficial to provide a flexible layer in between the soft-magnetic structure 150a and the piezoelectric layer. The soft-magnetic structure 150a is extended on the flexible layer, which acts as a stress buffer. This flexible layer may for example be a polymer layer, e.g. polyimide or silicone.

In preferred embodiments the piezoelectric layer is made in AlN, ZnO, AlScN or PZT.

As already mentioned, in preferred embodiments the switching functionality of the semiconductor device is realised by means of a FET. Below several further embodiments of the invention are discussed whereby the semiconductor switch is assumed to be a FET. This however does in no way limit the scope of the present invention.

Figure 2:
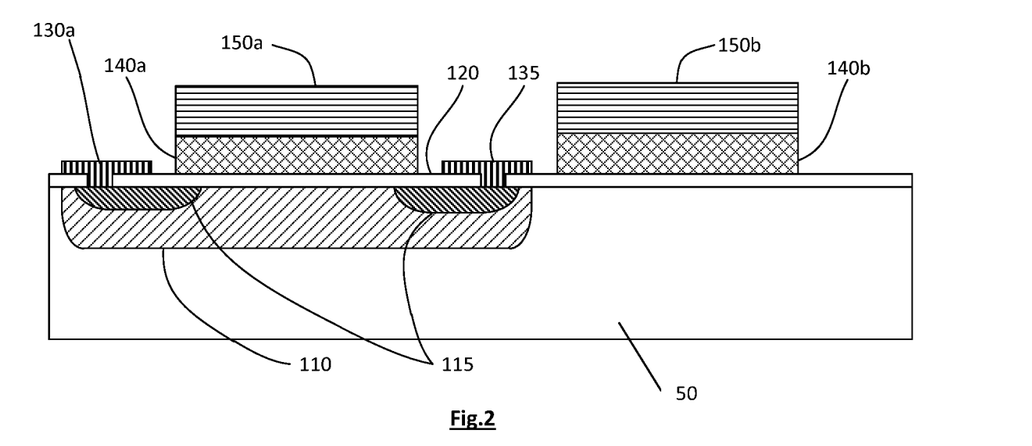
FIG. 2 illustrates an embodiment of the semiconductor device having an additional stack.

In the embodiment shown in FIG. 2 the set-up of FIG. 1 has been extended with an additional, second stack formed by an optional support layer 140b and a soft-magnetic structure 150b. There is a well-defined gap between this stack and the magneto-electric transducer formed by piezoelectric layer 140a and structure 150a. Preferably the gap is less than one third or even one-tenth of the thickness of the soft-magnetic structures 150a and 150b to maximise the magnetic force between the two soft magnetic structures. The thickness of the soft magnetic structures is typically in the range of 1 to 100 µm, e.g. 20 µm. The support layer 140b may be disposed on, over, adjacent to or in contact with the dielectric layer. In some embodiments the support layer 140b may be a piezoelectric layer. The additional stack then constitutes a second magneto-electric transducer. If the same material is used, the layer 140b may be produced in the same manufacturing step as piezoelectric layer 140a. In other embodiments the layer 140b is in another material than layer 140a, for example in SiO$_2$. The layer 140b is then produced in a different manufacturing step. On top of the layer 140b is provided the structure 150b, e.g. an integrated magnetic concentrator, similar to the structure 150a already discussed with respect to FIG. 1. In yet other embodiments there is no support layer and the soft-magnetic structure 150b is disposed directly on the dielectric layer (if the latter layer extends so far) or on the substrate. It is to be noted however that from a manufacturing point of view it is simpler to have the support layer present. In these embodiments there is still only one FET implemented (hence, just as in FIG. 1) and consequently only structure 150a is active. The additional stack formed by layer 140b and structure 150b is positioned with a narrow gap next to the stack formed by piezoelectric layer 140a and structure 150a. This second stack is used only to generate a force in a direction parallel to the substrate and create shear stress on the piezo layer 140a in the presence of a magnetic field. Indeed, when exposed to a magnetic field the two soft-magnetic structures 150a and 150b are pulled together and the pulling force between them is transferred to a shear force on the piezoelectric layer. The soft ferromagnetic material in the second structure 150b is in some embodiments the same as the soft ferromagnetic material in the first structure 150a. In other embodiments the two soft ferromagnetic materials may be different.

Figure 3:
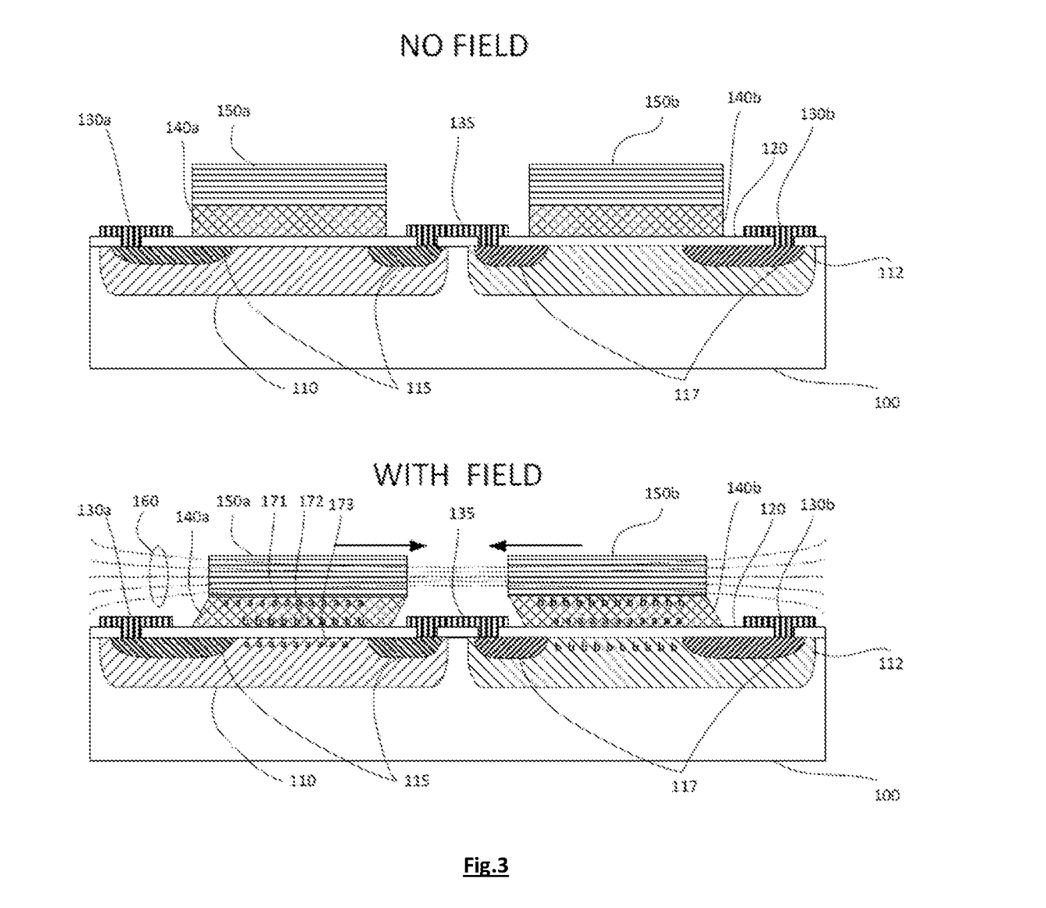
FIG. 3 illustrates an embodiment of the semiconductor device with two magneto-electric transducers.

In the embodiment illustrated in FIG. 3 an additional FET is positioned under the additional stack. The layer 140b in the additional second stack is in this embodiment a piezoelectric layer, so that the stack of piezoelectric layer 140b and additional structure 150b forms a second magnetoelectric transducer. In the substrate is embedded a diffusion region (112), i.e. a fourth diffusion region, lightly doped with a dopant of the opposite type of the dopant in diffusion region (110). In the lightly doped diffusion region (112) are provided a fifth and a sixth region (117) (a source and a drain, or alternatively, a drain and a source) which are heavily doped with the opposite type of dopant, i.e. if the first region (112) is p-type doped, then the regions (117) are n-type doped and vice versa. Two terminals are provided that form a source and a drain contact (135, 130b) (or drain and source contact), respectively. The piezoelectric layers (140a, 140b) preferably have an area substantially equal to the area of the channel created between the second and the third and the fifth and the sixth region, respectively. As illustrated in FIG. 3, in advantageous embodiments a terminal (135) may be shared between the two FETs. An opening is provided in the dielectric layer (gate oxide layer) for establishing a contact with each of the two regions (115,117). In other embodiments there is no common terminal and the two FETs have separate terminals with each a contact.

In some embodiments one or more holes can be provided in the first structure 150a and/or in second structure 150b to reduce their stiffness. Alternatively, one can also make grooves, or partial holes or grooves. This offers the benefit of increased stress for the same force, while the magnetic saturation is not affected.

As already explained before, in the present invention one surface of the piezoelectric layer is used as gate of the Field Effect Transistor (FET). The gate terminal that acts as a control terminal in the semiconductor device is so integrated with the piezoelectric layer in embodiments according to the invention. The FET channel is made conductive by the charge on the piezoelectric layer created by a magnetic field applied to the soft-magnetic structures.

When exposed to a magnetic field, as shown in the bottom part of FIG. 3, the two magneto-electric transducers separated by a small gap, are pulled together. The gap may be as narrow as one third or one tenth of the thickness of the soft magnetic structures 150a, 150b. By placing the soft-magnetic structures on the piezoelectric layer the pulling force between the transducers is transferred to a shear force on the piezoelectric layer and a charge is generated on the outer surfaces of this piezoelectric layer.

One FET channel is formed by a diffusion region 110 with a source and drain diffusion region 115 of the opposite type and contacted with the metal 130 and 135. In the embodiment of FIG. 3 the first diffusion region 110 is embedded in the substrate. The other FET channel is formed by the fourth diffusion region 112 (also embedded in the substrate in FIG. 3) with a source and drain diffusion region 117 of the opposite type and contacted with the metal 130b and 135. A piezoelectric layer 140a, 140b such as AlN is placed on the gate oxide 120 above the channel areas. The soft magnetic structures 150a and 150b are placed on the piezoelectric layers 140a and 140b. When a magnetic field 160 is applied, a shear stress in the piezoelectric layer 140a causes a charge 'a' at the top of this layer and a counter charge 'b' at the bottom of this layer. This charge 'b' turns the channel 110 in inversion and provides a low resistive path between the drain and source contacts 130a and 135. Similarly, in the other FET with opposite type of dopant charges 'b' are at the top of the piezoelectric layer 140b and counter charges 'a' at its bottom, which causes the channel in inversion and provides a low resistive path between the drain and source contacts 130b and 135.

In an alternative embodiment the first diffusion region 110 itself is the substrate. The fourth diffusion region 112 is then embedded in the substrate, i.e. in the first diffusion region 110.

By using soft magnetic materials with a high magnetic permeability one amplifies the external magnetic field inside the magnetic material.

The piezoelectric element may for example be dimensioned 100×100 μm or 20×20 μm. Alternatively, the piezoelectric element may have a rectangular shape with a length (L) and a width (W), where a ratio of the length and the width is a value in the range from 2 to 100 or from 2 to 40, for example in the range from 2 to 10, for example L/W equal to about 5. Both L and W have e.g. a value in the range of 5 to 200 μm. A smaller surface (for example, 10×10 or 20×20 μm) offers the advantage that a smaller force is needed to generate the same stress on the piezo layer. In turn, the length of the gap can be smaller for a given thickness.

Figure 4:
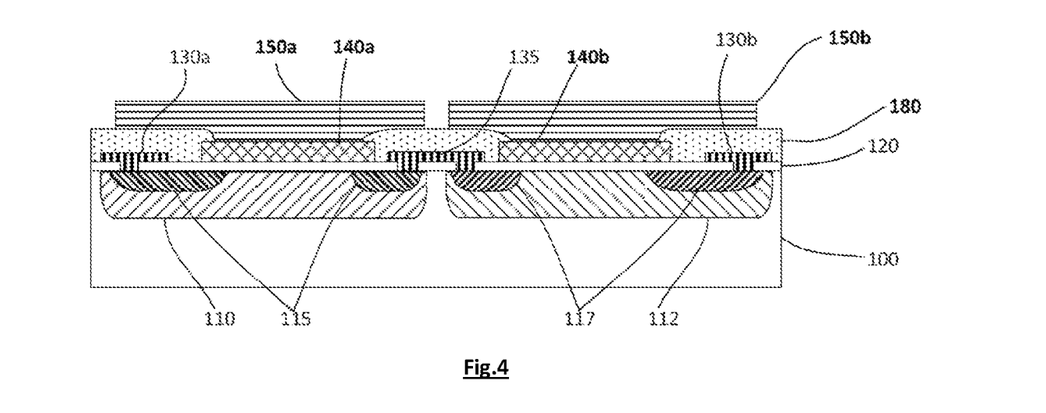
FIG. 4 illustrates an embodiment of the semiconductor device of the present invention.

Further improvements to the semiconductor device can be obtained by adapting the shape of the IMC. FIG. 4 illustrates a further embodiment of the device according to the invention. Compared to the embodiment shown in FIG. 3, the soft-magnetic structures (150a, 150b) are made much larger than the piezoelectric structures by extending the soft-magnetic structures on a flexible layer (180). This flexible layer may for example be a polymer layer, e.g. polyimide or silicone. In other embodiments another elastomer can be used, e.g. PMDS. Embodiments as in FIG. 4 are advantageous in that the force created in the entire soft-magnetic structure then is basically concentrated at the gap between the soft-magnetic structures (150a, 150b) on top of the flexible layer 180 and this gap can be made narrower than the gap between the piezoelectric structures (140a, 140b) by extending the soft-magnetic structures over the polymer layer (180). The force between the soft-magnetic structures (150a, 150b) is determined by the magnitude of the lateral magnetic field, the surface of the two facing walls of the soft-magnetic structures and the gap between the soft-magnetic structures. By means of the flexible layer (180) one can make the surface of the soft-magnetic structures (150a, 150b) 2, 10 or even 100 times larger than the surface of the piezoelectric structures. The force between the larger soft-magnetic structures is then concentrated on the smaller surfaces of the piezoelectric structures (140a, 140b) as the flexible layer (180) does not counteract the displacement of the soft-magnetic structures. The stress generating the charge in the piezoelectric structures is then defined as the force between the (large) soft magnetic structures (150a, 150b) and only the (small) surface of the piezoelectric structures (140a, 140b). Therefore the structure presented in FIG. 4 has clearly a much larger sensitivity than the structure presented in FIG. 3.

Figure 5:
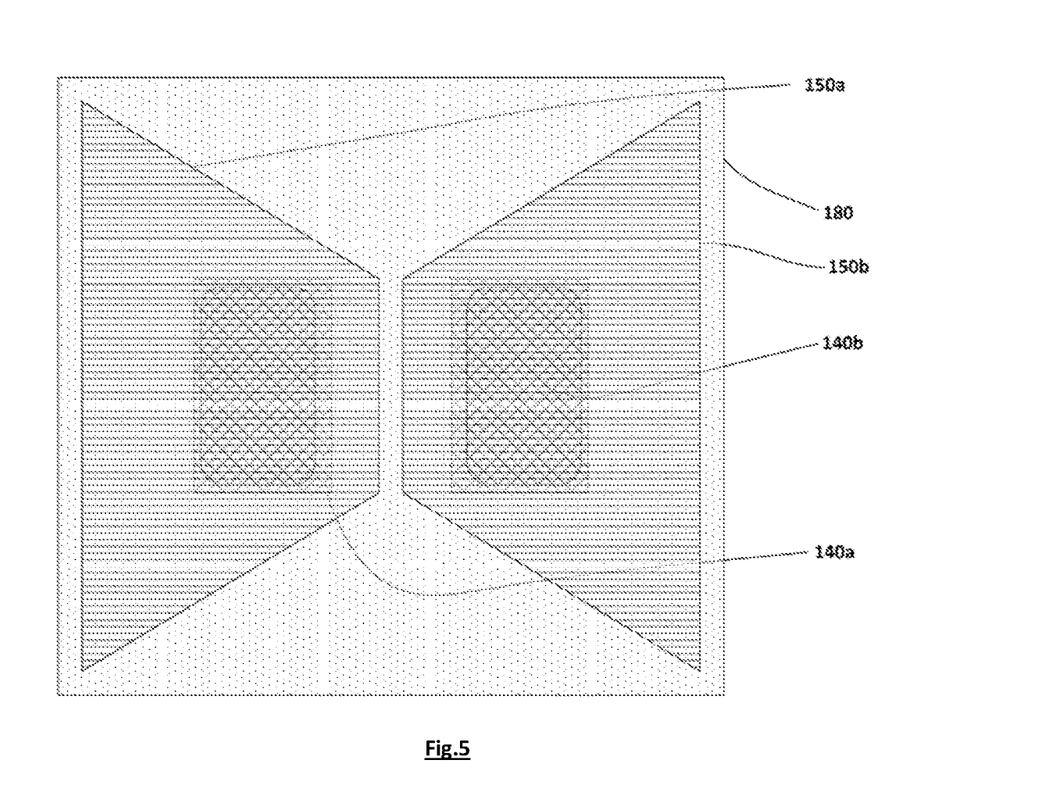
FIG. 5 illustrates the soft-magnetic structures having an outer edge larger than the edge facing the other structure.

FIG. 5 shows another preferred embodiment. The soft magnetic structures 150a and 150b are so shaped that a much larger edge is defined at the outside of the structure than at the faces facing each other in the middle. The edges of the structure facing each other in the middle may have a length between 100 μm and 6 mm, for example 250 μm. This means that the magnetic field between the facing edges is amplified with a number that comes close to the ratio of the length of the edges at the outside divided by the length of the edges at the inside. This ratio of the length of the outer edges of the soft-magnetic structures and the length of their opposite edges may in embodiments of the invention range from 1 to 20 and consequently, also the amplification factor of the magnetic field may range from 1 to 20.

Figure 6:
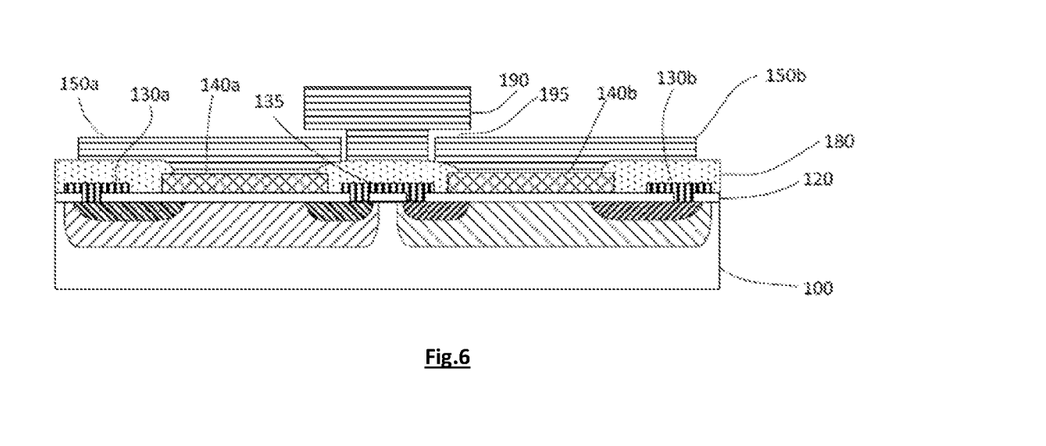
FIG. 6 illustrates an embodiment of the semiconductor device of the present invention wherein the fringing field is reduced.
Figure 7:
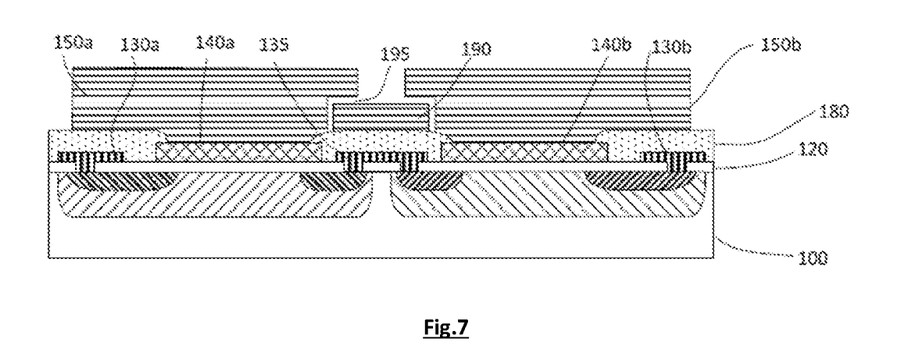
FIG. 7 illustrates an embodiment of the semiconductor device of the present invention wherein the fringing field is reduced.

FIG. 6 and FIG. 7 illustrate further embodiments of the semiconductor device. The devices as in FIG. 6 and FIG. 7 have undergone a further improvement by minimising the fringing field between two soft-magnetic structures (150a, 150b). The magnetic field between the soft-magnetic structures defines the force between the two structures and therefore the stress in the piezoelectric layers. By nature the magnetic field in the gap decreases by forming fringing fields around the gap (not indicated in the figures). This effect can be minimised by making the gap much narrower than the height and width of the soft-magnetic structures (150a, 150b). Fringing fields are the peripheral magnetic fields outside of the magnet core. FIG. 6 and FIG. 7 show two possible realisations of a semiconductor device with minimum fringing fields. One way is to plate the outer structures (150a, 150b) with a gap larger than the thickness of these structures. These structures are then covered with a spacer layer without removing the seed layer for electroplating of the soft-magnetic structures. Preferably this spacer layer consists of or comprises an oxide or a metal that can be etched away selectively from the soft-magnetic structures and the seed layer used for plating the soft-magnetic structures. With a photolithographic process the sacrificial layer is only removed between the soft-magnetic structures 150a, 150b and a second electroplating step is carried out to grow an additional soft-magnetic structure 190 between the already formed soft-magnetic structures 150a, 150b. After electroplating the additional structure 190 the spacer layer can be removed by etching and also the seed layer for electroplating can be removed. outside the structures 150 and 190.

Figure 8:
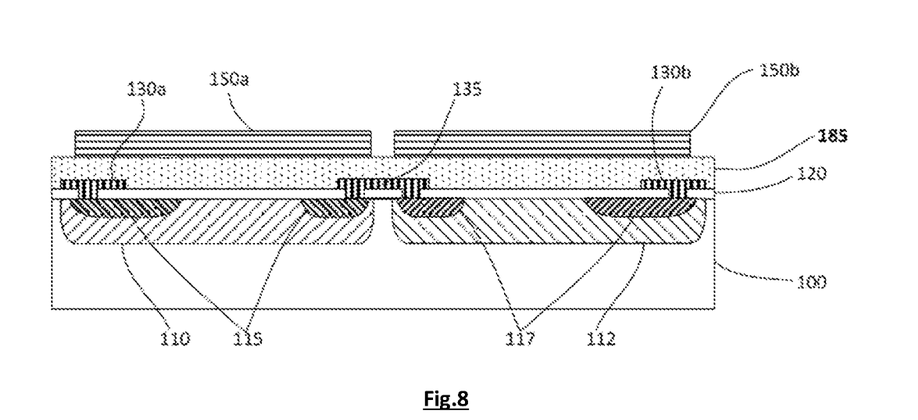
FIG. 8 illustrates an embodiment of the semiconductor device of the present invention wherein the piezoelectric layer is a polymer layer.

In the embodiment illustrated in FIG. 8 the piezoelectric layer is realised by applying a doped polymer where an elastomer is filled with piezoelectric particles. Such piezoelectric particles consist of materials such as e.g. AlN, ZnO, AlScN or PZT, for example by using a printing technology. The soft-magnetic structures (150a, 150b) are disposed on top of the piezoelectric polymer layer (185). Note that in this embodiment the surface of the piezo electric layer cannot be smaller than the surface of the soft-magnetic structures.

While the invention has been illustrated and described in detail in the drawings and foregoing description, such illustration and description are to be considered illustrative or exemplary and not restrictive. The foregoing description details certain embodiments of the invention. It will be appreciated, however, that no matter how detailed the foregoing appears in text, the invention may be practiced in many ways. The invention is not limited to the disclosed embodiments.

Other variations to the disclosed embodiments can be understood and effected by those skilled in the art in practicing the claimed invention, from a study of the drawings, the disclosure and the appended claims. In the claims, the word "comprising" does not exclude other elements or steps, and the indefinite article "a" or "an" does not exclude a plurality. A single processor or other unit may fulfil the functions of several items recited in the claims. The mere fact that certain measures are recited in mutually different dependent claims does not indicate that a combination of these measures cannot be used to advantage. A computer program may be stored/distributed on a suitable medium, such as an optical storage medium or a solid-state medium supplied together with or as part of other hardware, but may also be distributed in other forms, such as via the Internet or

The invention claimed is:

1. A semiconductor device comprising:
   a first diffusion region of a first type with embedded therein a second and a third diffusion region of a second type different from said first type, said second and said third diffusion region more doped than said first region, said second and third diffusion region each connected to a respective contact;
   a dielectric layer covering at least an edge of said second and third diffusion region and the region in between said second and third diffusion region;
   a piezoelectric layer disposed on, over, adjacent to or in contact with said dielectric layer;
   a first structure in a first soft ferromagnetic material; and
   a second structure in a second soft ferromagnetic material and separated from the first structure by a gap;
   wherein the first structure and the second structure are arranged such that both the first structure and second structure are pulled together to reduce the gap in response to a magnetic field.

2. The semiconductor device as in claim 1, wherein said second structure is disposed on a support layer.

3. The semiconductor device as in claim 2, wherein said support layer is a further piezoelectric layer.

4. The semiconductor device as in claim 3, further comprising a fourth diffusion region of said second type with embedded therein a fifth and a sixth diffusion region of said first type, said fifth and said sixth diffusion region more heavily doped than said fourth region, said fifth and sixth diffusion region each connected to a respective contact.

5. The semiconductor device as in claim 1, comprising a flexible layer whereon at least said structure is extended, said flexible layer having an opening to allow contact between said structure and said piezoelectric layer.

6. The semiconductor device as in claim 5, wherein said flexible layer also extends on said second structure.

7. The semiconductor device as in claim 1, wherein said structure has a larger edge at an outside of the semiconductor device than at a side facing said second structure.

8. The semiconductor device as in claim 1, comprising in the gap between said first structure and said second structure a further structure in a ferromagnetic material.

9. The semiconductor device as in claim 8, wherein said further structure is thinner than said first structure and said second structure.

10. The semiconductor layer as in claim 8, wherein said gap between said structures is comprised between 0.05 and 50 microns.

11. The semiconductor device as in claim 1, wherein said piezoelectric layer has a surface of substantially the same area as the area of a channel created, when in use, between said second and third diffusion region by charge displacement in said piezoelectric layer.

12. The semiconductor device as in claim 1, implemented as a field effect transistor.

13. The semiconductor device as in claim 1, wherein said first structure and/or said second structure is a magnetic concentrator.

14. The semiconductor device as in claim 1, wherein said piezoelectric layer is a polymer layer.

15. The semiconductor device as in claim 1, wherein said first structure has a surface with a larger area than the surface of the piezoelectric layer facing said first structure.

16. The semiconductor device as in claim 1, wherein said first soft ferromagnetic material and said second soft ferromagnetic material are the same.

17. A semiconductor device comprising:
   a first diffusion region of a first type with embedded therein a second and a third diffusion region of a second type different from said first type, said second and said third diffusion region more doped than said first region, said second and third diffusion region each connected to a respective contact;
   a dielectric layer covering at least an edge of said second and third diffusion region and the region in between said second and third diffusion region;
   a piezoelectric layer disposed on, over, adjacent to or in contact with said dielectric layer;
   a first structure in a first soft ferromagnetic material and arranged to perform mechanical stress on said piezoelectric layer in response to a magnetic field; and
   a flexible layer whereon at least said structure is extended, said flexible layer having an opening to allow contact between said structure and said piezoelectric layer.

18. A semiconductor device comprising:
   a first diffusion region of a first type with embedded therein a second and a third diffusion region of a second type different from said first type, said second and said third diffusion region more doped than said first region, said second and third diffusion region each connected to a respective contact;
   a dielectric layer covering at least an edge of said second and third diffusion region and the region in between said second and third diffusion region;
   a piezoelectric layer disposed on, over, adjacent to or in contact with said dielectric layer;
   a first structure in a first soft ferromagnetic material; and
   a second structure in a second soft ferromagnetic material and separated from the first structure by a gap;
   wherein said gap between said structures is comprised between 0.05 and 50 microns, such that the first structure and the second structure are both arranged to perform mechanical stress on said piezoelectric layer by both the first structure and the second structure being pulled together in response to a common magnetic field.

* * * * *